United States Patent
Talin et al.

(10) Patent No.: US 7,432,024 B2
(45) Date of Patent: Oct. 7, 2008

(54) LITHOGRAPHIC TEMPLATE AND METHOD OF FORMATION AND USE

(75) Inventors: Albert Alec Talin, Scottsdale, AZ (US);
Jeffrey H. Baker, Chandler, AZ (US);
William J. Dauksher, Mesa, AZ (US);
Andy Hooper, Chandler, AZ (US);
Douglas J. Resnick, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 115 days.

(21) Appl. No.: 11/423,621

(22) Filed: Jun. 12, 2006

(65) Prior Publication Data

US 2006/0222968 A1 Oct. 5, 2006

Related U.S. Application Data

(62) Division of application No. 10/222,734, filed on Aug. 15, 2002, now Pat. No. 7,083,880.

(51) Int. Cl.
*G03F 1/00* (2006.01)
*G03C 5/00* (2006.01)

(52) U.S. Cl. .......................................... 430/5; 430/394

(58) Field of Classification Search .................. 430/5, 430/394
See application file for complete search history.

(56) References Cited

U.S. PATENT DOCUMENTS 5,817,242 A 10/1998 Biebuyck et al.
5,952,127 A 9/1999 Yamanaka
6,004,699 A 12/1999 Yasuzato et al.
6,387,787 B1 5/2002 Mancini et al.
6,635,393 B2 10/2003 Pierrat
6,653,030 B2 * 11/2003 Mei et al. ........................ 430/5

OTHER PUBLICATIONS

Dobkin "Plasma-Enhanced Deposition from TEOS and Oxygen"; http://www.batnet.com/enigmatics/semiconductor_processing/CVD_Fundamentals/films/PECVD_TEOS.html.

(Continued)

*Primary Examiner*—Stephen Rosasco
(74) *Attorney, Agent, or Firm*—Susan C. Hill

(57) ABSTRACT

This invention relates to semiconductor devices, microelectronic devices, micro electro mechanical devices, microfluidic devices, photonic devices, and more particularly to a lithographic template, a method of forming the lithographic template and a method for forming devices with the lithographic template. The lithographic template (10) is formed having a substrate (12), a transparent conductive layer (16) formed on a surface (14) of the substrate (12) by low pressure sputtering to a thickness that allows for preferably 90% transmission of ultraviolet light therethrough, and a patterning layer (20) formed on a surface (18) of the transparent conductive layer (16). The template (10) is used in the fabrication of a semiconductor device (30) for affecting a pattern in device (30) by positioning the template (10) in close proximity to semiconductor device (30) having a radiation sensitive material formed thereon and applying a pressure to cause the radiation sensitive material to flow into the relief image present on the template. Radiation is then applied through the template so as to cure portions of the radiation sensitive material and define the pattern in the radiation sensitive material. The template (10) is then removed to complete fabrication of semiconductor device (30).

20 Claims, 2 Drawing Sheets

OTHER PUBLICATIONS

Wolf et al; "Low Pressure Chemical Vapor Deposition Reactors"; Silicon Processing for the VLSI Era; vol. 1: Process Technology, Second Edition, Section 6.2.4; Sunset Beach, California; pp. 172-173.

Gordon, "Criteria For Choosing Transparent Conductors," MRS Bulletin/Aug. 2000, XP-01087787, pp. 52-57.

Kiuchi et al., "Titanium Nitride for Transparent Conductors," 1994 American Institute of Physics, Applied Physics Letters, Feb. 21, 1994, XP000425897, pp. 1048-1049.

Resnick et al., "New Methods for Fabricating Step and Flash Imprint Lithography Templates," Proceedings of SPIE vol. 4608 (2002), SPIE, XP-002276868, pp. 176-181.

Ben-Shalom et al., "SnO2 Transparent Conductor Films Produced by Filtered Vacuum Arc Deposition," Elsevier Sequoia, Dec. 15, 1993, XP000415509, pp. 20-26.

Park et al., "Characterization of SnO2 Films on Glass by Transmission Electron Microscopy," Elsevier Science S.A., 2000, pp. 7-11.

Minami et al, "Highly Transparent and Conductive Zn2In2O5 Thin Films Prepared by RF Magnetron Sputtering," Jpn. J. Appl. Phys. vol. 34 (1995), pp. L971-L974.

* cited by examiner

LITHOGRAPHIC TEMPLATE AND METHOD OF FORMATION AND USE

FIELD OF THE INVENTION

The present invention relates to semiconductor devices, microelectronic devices, micro electro mechanical devices, microfluidic devices, photonic devices, and more particularly to a lithographic template, a method of forming the lithographic template and a method for forming semiconductor devices with the lithographic template.

BACKGROUND OF THE INVENTION

The fabrication of integrated circuits involves the creation of several layers of materials that interact in some fashion. One or more of these layers may be patterned so various regions of the layer have different electrical characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned.

Lithographic processes such as that described above are typically used to transfer patterns from a photomask to a device. As feature sizes on semiconductor devices decrease into the submicron range, there is a need for new lithographic processes, or techniques, to pattern high-density semiconductor devices. Several new lithographic techniques which accomplish this need and have a basis in imprinting and stamping have been proposed. One in particular, Step and Flash Imprint Lithography (SFIL) has been shown to be capable of patterning lines as small as 20 nm.

SFIL templates are typically made by applying a layer of chrome, 10-100 nm thick, on to a transparent quartz plate. A resist layer is applied to the chrome and patterned using either an electron beam or optical exposure system. The resist is then placed in a developer to form patterns on the chrome layer. The resist is used as a mask to etch the chrome layer. The chrome then serves as a hard mask for the etching of the quartz plate. Finally, the chrome is removed, thereby forming a quartz template containing relief images in the quartz.

Overall, SFIL techniques benefit from their unique use of photochemistry, the use of ambient temperatures, and the low pressure required to carry out the SFIL process. During a typical SFIL process, a substrate is coated with an organic planarization layer, and brought into close proximity of a transparent SFIL template, typically comprised of quartz, containing a relief image and coated with a low surface energy material. An ultraviolet or deep ultraviolet sensitive photocurable organic solution is deposited between the template and the coated substrate. Using minimal pressure, the template is brought into contact with the substrate, and more particularly the photocurable organic layer. Next, the organic layer is cured, or crosslinked, at room temperature by illuminating through the template. The light source typically uses ultraviolet radiation. A range of wavelengths (150 nm-500 nm) is possible, however, depending upon the transmissive properties of the template and photosensitivity of the photocurable organic. The template is next separated from the substrate and the organic layer, leaving behind an organic replica of the template relief on the planarization layer. This pattern is then etched with a short halogen break-through, followed by an oxygen reactive ion etch (RIE) to form a high-resolution, high aspect-ratio feature in the organic layer and planarization layer.

The distinction between a lithographic mask and a lithographic template should be noted. A lithographic mask is used as a stencil to impart an aerial image of light into a photoresist material. A lithographic template has a relief image etched into its surface, creating a form or mold. A pattern is defined when a photocurable liquid flows into the relief image and is subsequently cured. The attributes necessary for masks and templates, therefore, are quite different.

SFIL technology has been demonstrated to resolve features as small as 20 nm. As such, a wide variety of feature sizes may be drawn on a single wafer. Certain problems exist though with this SFIL template fabrication methodology as described above. In particular, problems exist with respect to: (i) uniform etching of the quartz template when only a chrome hard mask is utilized; (ii) image distorting charging effects during electron beam patterning of the template; (iii) the effects of charging during scanning electron microscope inspection of the fabricated template; and (iv) the elimination of the detection of false defects during optical or e-beam defect inspection.

Of concern is the fact that quartz is very resistive and prone to charging during e-beam irradiation. Accordingly, there is a desire to include within the template fabrication a transparent conductive coating to eliminate this concern. The inclusion of a transparent conductive coating, or layer, will provide for the elimination of image distorting charging effects during electron beam patterning of the template, elimination of charging effects during scanning electron microscope inspection of the fabricated template, and service as an etch stop barrier layer during oxide patterning. The most convenient transparent conductive material is indium-tin-oxide (ITO), although many other transparent conductive materials providing these benefits can be used. Common deposition techniques for ITO involve heating the substrate to approximately 200° C. during the deposition process. Unfortunately, this produces films which are rough and grainy. This production of a rough and grainy conductive layer will not produce the desired results as described above.

In addition, there exist problems with the electron-beam writing of the template and the inspection of the template subsequent to fabrication. With the inclusion of a conductive layer, charge build-up during electron-beam exposure is avoided. In addition, inspectability is achievable due to the template being comprised of multiple materials. Typical inspection systems use either light (ultraviolet or deep ultraviolet) or electrons to determine feature size and detect unwanted defects on the template. Light-based systems require a difference in reflection or index of refraction between patterned and unpatterned areas of the template to provide good image contrast. Likewise, an electron-based system requires a difference in atomic number between patterned and unpatterned areas of the template. To overcome this problem, multiple materials having either different optical properties or different atomic numbers would allow for inspection, a necessity for sub-100 nm features.

Accordingly, it would be beneficial to provide for a means of eliminating image distorting charging effects during electron beam patterning of the template and eliminate charging effects during scanning electron microscope inspection of the fabricated template.

It is a purpose of the present invention to provide for an improved lithographic template, a method of fabricating the improved lithographic template, and a method for making semiconductor devices with the improved lithographic template in which included is a transparent conductive layer.

It is a purpose of the present invention to provide for an improved lithographic template, a method of fabricating the improved lithographic template, and a method for making semiconductor devices with the improved lithographic template in which elimination of image distorting charging effects during electron beam patterning of the template is achieved.

It is a purpose of the present invention to provide for an improved lithographic template, a method of fabricating the improved lithographic template, and a method for making semiconductor devices with the improved lithographic template in which elimination of charging effects during scanning electron microscope inspection is achieved.

It is yet another purpose of the present invention to provide for an improved lithographic template, a method of fabricating the improved lithographic template, and a method for making semiconductor devices with the improved lithographic template in which improvement in the inspection of sub-micron structures is achieved by eliminating false defects during optical and e-beam defect inspection.

SUMMARY OF THE INVENTION

This invention relates to semiconductor devices, microelectronic devices, micro electro mechanical devices, microfluidic devices, and more particularly to a lithographic template, a method of forming the lithographic template and a method for forming devices with the lithographic template. Disclosed is a lithographic template including a substrate, a transparent conductive layer, and an etched patterning layer. The lithographic template is formed by providing a transparent substrate and forming a transparent conductive layer on the substrate using low pressure sputtering techniques, thereby providing for a smooth layer having conductive properties sufficient to eliminate surface charging, while maintaining transparency to ultraviolet light. The next steps in forming the lithographic template include, forming a patterning layer on the smooth transparent conductive layer, forming a patterned resist layer on the patterning layer, etching the patterning layer to expose portions of the smooth transparent conductive layer, and removing the patterned resist layer to expose the etched patterning layer, thus defining a lithographic template. Additionally, disclosed is a method for making a device with the lithographic template as provided, including the steps of providing a substrate, coating the substrate with a photocurable liquid, providing a lithographic template as previously disclosed, positioning the lithographic template in contact with the photocurable liquid, applying pressure to the template so that a pattern is created in the photocurable liquid, transmitting radiation through the lithographic template to expose at least a portion of the photocurable material on the substrate, thereby further affecting the pattern in the photocurable liquid, and removing the template from the substrate.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

Figure 1:
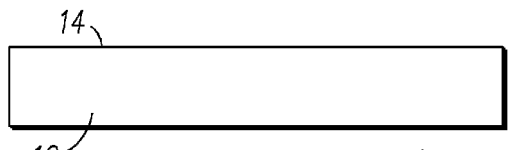
FIGS. 1-7 illustrate in cross-section views, process steps for fabricating a lithographic template in accordance with the present invention.

It will be appreciated that for simplicity and clarity of illustration, elements illustrated in the drawings have not necessarily been drawn to scale. For example, the dimensions of some of the elements are exaggerated relative to other elements for purposes of clarity. Furthermore, where considered appropriate, reference numerals have been repeated among the drawings to indicate corresponding or analogous elements.

DESCRIPTION OF THE PREFERRED EMBODIMENT

The present invention relates to the elimination of image distorting charging effects during electron beam patterning of a template used in step and flash imprint lithography (SFIL), the elimination of charging effect during scanning electron microscope inspection of the fabricated templates, and the elimination of false defects during optical and e-beam defect inspection. It is proposed that a bi-layer of materials be deposited on a substrate surface, thereby forming a lithographic template including these improvements. Referring to FIGS. 1-7, illustrated in cross-sectional views, are a plurality of process steps for fabricating a lithographic template according to the present invention. Referring more specifically to FIG. 1, illustrated is a first step in the process of fabricating a lithographic template 10 according to the present invention. More specifically, illustrated is substrate 12, having a surface 14. Substrate 12 is disclosed as being comprised of a transparent material, such as a quartz material, a polycarbonate material, a pyrex material, a calcium fluoride ($CaF_2$) material, a magnesium fluoride material ($MgF_2$), or any other similar type of material, that is transparent to light. Substrate 12 is formed of a transparent material to allow for the passage therethrough of light.

Figure 2:
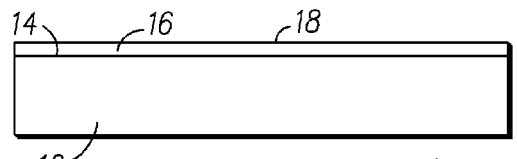

Referring now to FIG. 2, illustrated is substrate 12, having deposited thereon surface 14, a transparent conductive layer 16. Transparent conductive layer 16 is disclosed as being formed of a transparent material thereby providing for the subsequent passing therethrough of preferably 90% of light in the ultraviolet range. Various materials are proposed for fabrication of transparent conductive layer 16. It is disclosed that the specific type of material utilized will have bearing on the resulting process steps that must be undertaken to complete fabrication of template 10. Transparent materials that are disclosed as being suitable for the fabrication of transparent conductive layer 16 include zinc tin oxide ($Zn_2SnO_4$), zinc tin oxide ($ZnSnO_3$), zinc indium oxide ($Zn_2In_2O_5$), zinc oxide (ZnO), zinc oxide doped with aluminum (ZnO:Al), zinc oxide doped with fluorine (ZnO:F), zinc oxide doped with gallium, (ZnO:Ga), zinc oxide doped with boron (ZnO:B), zinc oxide doped with indium (ZnO:In), magnesium indium oxide ($MgIn_2O_4$), gallium indium oxide ($GaInO_3$), gallium indium oxide (($Ga,In)_2O_3$), indium tin oxide ($In_4Sn_3O_{12}$), indium oxide doped with tin ($In_2O_3$:Sn), cadmium tin oxide ($Cd_2SnO_4$), tin oxide ($SnO_2$), tin oxide doped with fluorine ($SnO_2$:F), tin oxide doped with antimony ($SnO_2$:Sb), titanium nitride (TiN), tantalum nitride (TaN), or the like. Transparent conductive layer 16 is formed to assist with the elimination of image distorting charging effects that occur during electron beam patterning of the template, elimination of charging effects that occur during scanning electron microscope inspection of the fabricated template, elimination of false defects during optical and e-beam defect inspection, and to serve as an etch stop barrier during subsequent patterning of the remaining layers. Transparent conductive layer 16 is disclosed as 15 having a thickness dependent upon the charge conductivity of the material used, the transmissive properties of the material used, and the etch selectivity to the patterning layer. It is disclosed that transparent conductive layer 16 is preferable formed as smooth as substrate surface 14 on which it is formed. More specifically, transparent conductive layer 16 is described as being formed: (i) extremely smooth (<1 nm rms, and preferably <0.3 nm rms); (ii) having the ability to transmit therethrough approximately 90% or greater ultraviolet light used during subsequent processing steps; (iii) sufficiently conductive to eliminate surface charging; and (iv) having a sufficiently low etch rate relative to the patterning layer in order to overcome any microloading effects. In addition, transparent conductive layer 16 must have sufficient strength to survive the stresses associated with template manufacturing and subsequent handling during the fabrication of the semiconductor devices with the completed lithographic template. In a preferred embodiment, transparent conductive layer 16 is formed of indium-tin-oxide (ITO).

Transparent conductive layer 16 is disclosed as having a thickness that is adjusted for maximum transmittance of radiation used to cure a subsequent resist layer (discussed presently) present within the template structure. Typically this thickness is in a range of 10-1000 nm, having a preferred thickness of approximately 80 nm, thereby able to transmit ultraviolet light, and more particularly light having a wavelength of 365 nm. Transparent conductive layer 16 is formed having a surface 18, on surface 14 of substrate 12 by sputtering. Deposition conditions which will yield a layer with the desired qualities for SFIL include: (i) low pressure sputtering, generally less than 6 m Torr, and preferably less than 3 m Torr; (ii) a low oxygen partial pressure, typically less than 2%; (iii) at a power of 100 Watts RF for a 100 cm diameter target; and (iv) a sputtering rate of 5-10 nm/min. During the sputtering of transparent conductive layer 16, no external heat is applied to substrate 12. Subsequent to the sputtering deposition of transparent conductive layer 16 onto substrate 12, transparent conductive layer 16 is annealed at approximately 325° C. (dependent upon material) for approximately 30 minutes in an ambient air oven.

Transparent conductive layer 16 is formed of a material having a resistivity of below one kilo ohm-cm, and preferably below 1 ohm-cm. Fabrication of transparent conductive layer 16 as disclosed herein results in an ITO film having resistivity of less than 1 ohm-cm, as compared to 0.001 ohm-cm for many commercial ITO films. These commercial ITO films do not have the high transmittance at UV wavelengths required to cure the SFIL resist, and have an order of magnitude higher roughness, which is detrimental to nanometer scale lithography. Fabrication of transparent conductive layer 16 in this manner optimizes the UV transmittance and low surface roughness of the layer, while providing sufficient conductivity to eliminate charging during e-beam patterning or post fabrication SEM inspection. Commercial ITO processes optimize low resistivity and transmittance in the visible portion of the spectrum.

Figure 3:
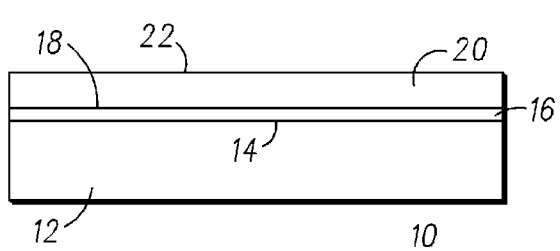

Referring now to FIG. 3, illustrated is substrate 12, having formed thereon transparent conductive layer 16. There is additionally formed on surface 18 of transparent conductive layer 16, a patterning layer 20. Patterning layer 20 is disclosed as being formed of either an opaque or transparent material, dependent upon overall design objective, as well as the material comprising transparent conductive layer 16. More specifically, it is disclosed that the specific type of material utilized will have bearing on the resulting process steps that must be undertaken to complete fabrication of template 10. Patterning layer 20 is generally disclosed as being formed of a material having a different reflectivity (or index of refraction) or different atomic number than the material used for transparent conductive layer 16. This difference in atomic number will provide for improved inspectability properties, as described presently. Transparent materials that are disclosed as being suitable for the fabrication of patterning layer 20 are silicon dioxide ($SiO_2$), silicon nitride (SiN), silicon oxy-nitride (SiON), indium-tin-oxide (ITO), or the like. Opaque materials that are disclosed as being suitable for the fabrication of patterning layer 20 are tungsten (W), tungsten silicide (WSi), tungsten silicon nitride (WSiN), tungsten alloys, tantalum (Ta), tantalum silicide (TaSi) or ($TaSi_x$), where $1<x<2$, tantalum silicon nitride (TaSiN), tantalum alloys, titanium (Ti), titanium alloys, molybdenum (Mo), molybdenum silicide (MoSi) or ($MoSi_x$), where $1<x<2$, molybdenum alloys, gold (Au), chrome (Cr), or the like. It should be noted that some patterning layers may not require a transparent conductive layer, since the substrate itself may perform sufficiently as an etch stop material. Patterning layer 20 may be used to assist charge dissipation during e-beam writing. In addition, patterning layer 20 aids in SEM-based template inspection due to the varying materials utilized in the plurality of layers. Patterning layer 20 is disclosed as generally having a thickness dependent upon the desired aspect ratio of the photocurable resist. Specifically, patterning layer 20 will need to have sufficient mechanical strength and durability to survive the stresses associated with template manufacturing and subsequent handling during the fabrication of the semiconductor devices with the completed lithographic template. Patterning layer 20 is therefore generally disclosed as having a thickness of between 10 and 5000 nm, and a preferred thickness of at least 50 nm. Patterning layer 20, having a surface 22, is formed on surface 18 of transparent conductive layer 16 by spin coating, sputtering, vapor deposition, or the like.

Figure 4:
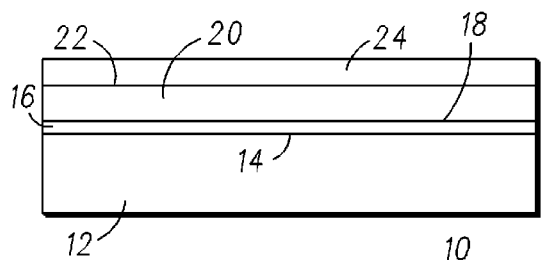
Figure 5:
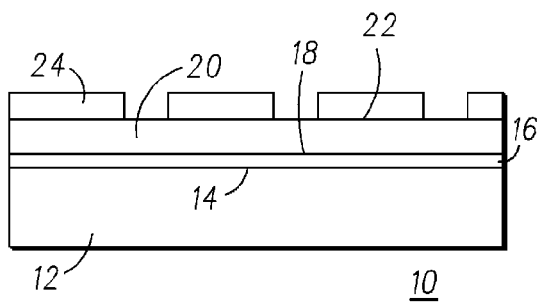

Referring now to FIGS. 4 and 5, illustrated is substrate 12, having formed thereon surface 14, transparent conductive layer 16 and patterning layer 20, formed on surface 18 of transparent conductive layer 16. Formed thereon surface 22 of patterning layer 20 is a resist layer 24, which is patterned as illustrated in FIG. 5 by standard optical or e-beam patterning techniques. Resist layer 24 is typically formed of a standard photoresist or electron-beam resist material well know in the art such as an organic polymer that is patterned so as to serve as a mask for the subsequent etching of patterning layer 20. It is additionally disclosed that anticipated by this disclosure is the optional inclusion of a hardmask layer (not shown), sandwiched between patterning layer 20 and resist layer 24. In the instance where a hard mask layer is included, it is anticipated that it would be formed of chrome (Cr), silicon dioxide ($SiO_2$), silicon oxy-nitride (SiON), silicon nitride (SiN), or the like.

Figure 6:
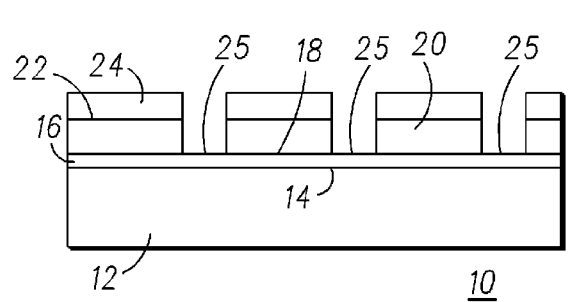

During fabrication, photoresist layer 24 serves as a mask for the etching therethrough of patterning layer 20. As illustrated in FIG. 6, patterning layer 20 is etched through to surface 18 of transparent conductive layer 16, thereby exposing portions 25 of transparent conductive layer 16. Etching of patterning layer 20 is accomplished through standard wet or dry etch techniques. Next, patterning layer 20 is overetched, if required, to provide for improved uniformity stopping against transparent conductive layer 16. Finally, to complete template 10, resist layer 24 is removed.

Figure 7:
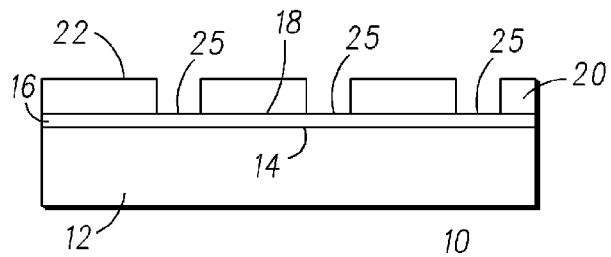

FIG. 7 illustrates in cross-sectional view, a completed lithographic template 10 including substrate 12 having surface 14, transparent conductive layer 16 overlying surface 14 of substrate 12, transparent conductive layer 16 having a surface 18, and patterning layer 20 overlying surface 18 of transparent conductive layer 16. Upon completion, template 10 defines therein a relief image 26.

In addition, while it is disclosed herein that template 10 is a single tiered structure, it is anticipated by this disclosure that template 10 can be formed as a multi-tiered structure having a transparent conductive layer present therein. Further information on the fabrication of a multi-tiered lithographic template can be found in pending U.S. Patent application, bearing Ser. No. 10/081,199, and attorney docket number CR 01-031, filed Feb. 22, 2002, entitled "METHOD OF FABRICATING A TIERED STRUCTURE USING A MULTI-LAYERED RESIST STACK AND USE", assigned to the same assignee and incorporated herein by this reference.

Figure 8:
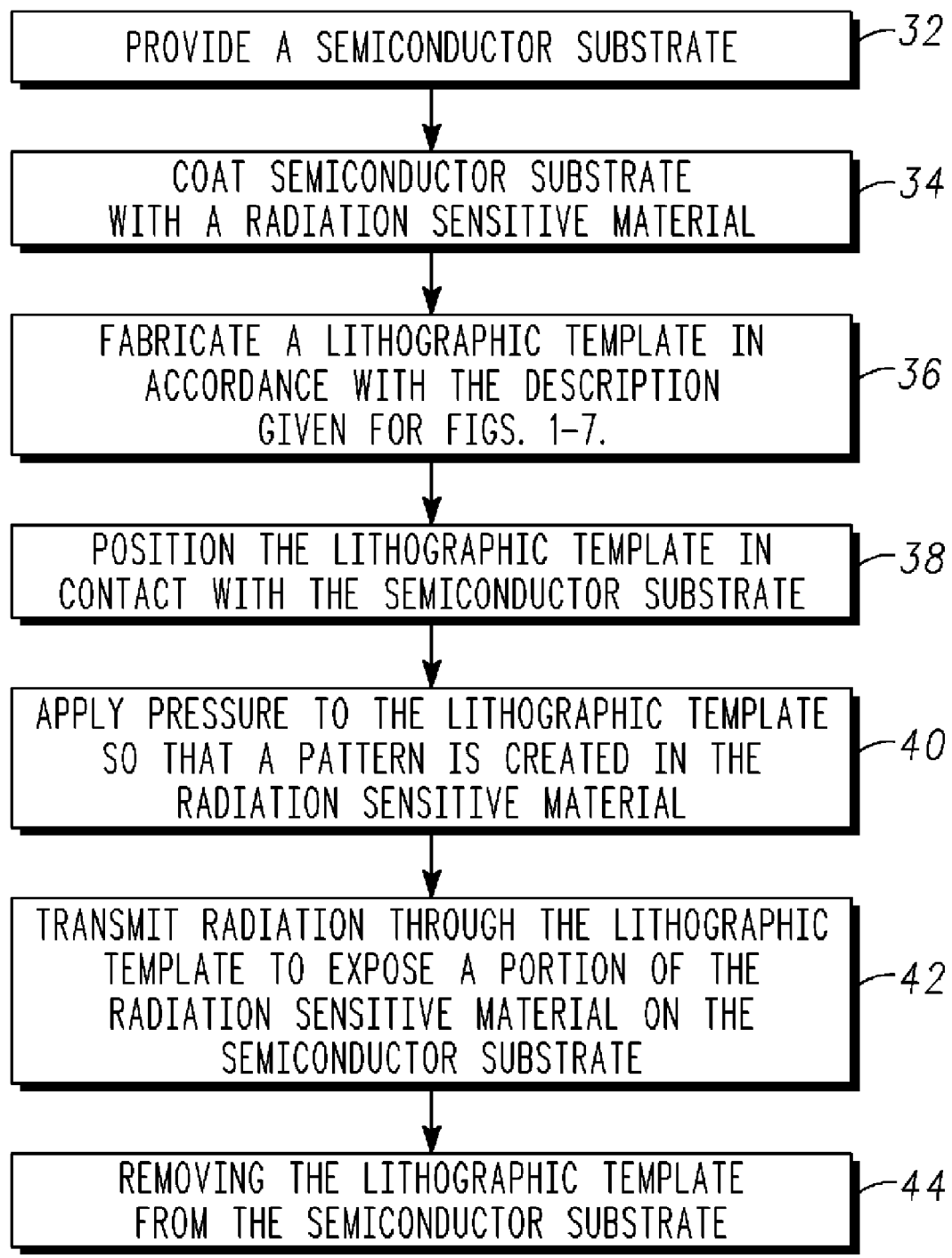
FIG. 8 is a simplified process flow diagram fabricating a semiconductor device with a lithographic template in accordance with the present invention.

Shown in FIG. 8 is a process flow diagram wherein a lithographic template, generally similar to template 10 of FIGS. 1-7, fabricated in accordance with the present invention is used to fabricate a semiconductor device 30. Initially, a semiconductor substrate 32 is provided. Semiconductor substrate is then coated 34 with a radiation sensitive material, such as a photocurable organic layer or a photoresist layer. The semiconductor substrate may have overlying devices or device layer such as polysilicon, oxide, metal, etc., as well as trench and diffusion regions or the like. A lithographic template is fabricated 36 in accordance with the description given for FIGS. 1-7. The radiation sensitive material layer coated semiconductor substrate is then placed adjacent 38 the lithographic template. A slight pressure is applied 40 to the template so that the radiation sensitive material layer flows into the relief images on the template. Radiation is then transmitted 42 through the lithographic template, including the substrate, the transparent conductive layer and the patterning layer (for the cases when the patterning layer is transparent), and imaged onto the radiation sensitive material layer coated semiconductor substrate to further define and expose a pattern in the radiation sensitive material layer. The template is thereafter removed 44 from the semiconductor device, thereby leaving a patterned organic layer which is then used as an image layer for subsequent processing. The photoresist layer can then be used as a mask, either in conjunction with ion implantation to form implanted regions in the semiconductor substrate, or can be used in conjunction with conventional wet or dry etches to transfer the pattern into the semiconductor substrate, or into device layers overlying the semiconductor substrate. It should be understood that although the template fabricated in accordance with the present invention is described in the preferred embodiment as being used to fabricate a semiconductor device, that anticipated is the use of a template, generally similar to template 10 of FIGS. 7, to form microelectronic devices, micro electro mechanical devices, and microfluidic devices.

The foregoing description and illustrations contained herein demonstrate many of the advantages associated with the present invention. In particular, the present invention provides for elimination of image distorting charging effects during electron beam patterning of the template and elimination of charging effects during scanning electron microscope inspection of the fabricated template.

Thus it is apparent that there has been provided, in accordance with the invention, a lithographic template, and a method of its formation and use that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method for making a device comprising the steps of:
   coating a substrate with a radiation sensitive material layer;
   providing a lithographic template; wherein the lithographic template comprises;
   a substrate having a surface;
   a transparent conductive layer, deposited using a pressure less than 6m Torr, on the surface of the substrate; and
   an etched patterning layer formed on a surface of the transparent conductive layer, the etched patterning layer having defined therein a relief image;
   positioning the lithographic template in contact with the radiation sensitive material layer, the radiation sensitive material layer being between the template and the substrate;
   applying pressure to the template, the radiation sensitive material thereby flowing into the relief pattern on the template;
   transmitting radiation through the lithographic template to expose at least a portion of the radiation sensitive material layer on the substrate, thereby further affecting the pattern in the radiation sensitive material layer; and
   removing the template from the substrate.

2. A method for making a device as claimed in claim 1 wherein the step of providing a lithographic template comprising a transparent conductive layer includes providing a transparent conductive layer characterized as one of zinc tin oxide ($Zn_2SnO_4$), zinc tin oxide ($ZnSnO_3$), zinc indium oxide ($Zn_2In_2O_5$), zinc oxide (ZnO), zinc oxide doped with aluminum (ZnO:Al), zinc oxide doped with fluorine (ZnO:F), zinc oxide doped with gallium, (ZnO:Ga), zinc oxide doped with boron (ZnO:B), zinc oxide doped with indium (ZnO:In), magnesium indium oxide ($MgIn_2O_4$), gallium indium oxide ($GaInO_3$), gallium indium oxide (($Ga,In)_2O_3$), indium tin oxide ($In_4Sn_3O_{12}$), indium oxide doped with tin ($In_2O_3$:Sn), cadmium tin oxide ($Cd_2SnO_4$), tin oxide ($SnO_2$), tin oxide doped with fluorine ($SnO_2$:F), tin oxide doped with antimony ($SnO_2$:Sb), or titanium nitride (TiN).

3. A method for making a device as claimed in claim 2 wherein the transparent conductive layer includes providing a transparent conductive layer having a thickness adjusted for maximum transmittance of radiation used to cure a patterned resist layer utilized in forming the etched patterning layer.

4. A method for making a device as claimed in claim 1 wherein the step of transmitting radiation through the lithographic template is further characterized as transmitting ultraviolet light through the lithographic template.

5. A method for making a device as claimed in claim 1 wherein the step of transmitting radiation through the lithographic template is further characterized as transmitting deep ultraviolet light through the lithographic template.

6. A method for making a device as claimed in claim 1 wherein the radiation sensitive material layer is further characterized as coating the substrate with a photocurable material layer.

7. A method for making a device as claimed in claim 1 wherein the device is one of a semiconductor device, a microelectronic device, a micro electro mechanical device, a photonic device, or a microfluidic device.

8. A method for making a device as claimed in claim 1 wherein the transparent conductive layer comprises zinc.

9. A method for making a device as claimed in claim 8 wherein the transparent conductive layer further comprises oxygen.

10. A method for making a device as claimed in claim 1 wherein the transparent conductive layer comprises indium.

11. A method for making a device as claimed in claim 1 wherein the transparent conductive layer comprises tin.

12. A method for making a device as claimed in claim 1 wherein the transparent conductive layer comprises gallium.

13. A method for making a device as claimed in claim 1 wherein the transparent conductive layer comprises cadmium.

14. A method for making a device as claimed in claim 1 wherein the transparent conductive layer comprises magnesium.

15. A method for making a device as claimed in claim 1 wherein the transparent conductive layer comprises oxygen.

16. A method for making a device as claimed in claim 1 wherein the transparent conductive layer comprises a dopant.

17. A method for making a device as claimed in claim 16 wherein the dopant comprises fluorine.

18. A method for making a device comprising the steps of:
coating a substrate with a radiation sensitive material layer;
providing a lithographic template; wherein the lithographic template comprises;
a substrate having a surface;
a transparent conductive layer, deposited using a pressure less than 6 m Torr, on the surface of the substrate; and
an etched patterning layer formed on a surface of the transparent conductive layer, the etched patterning layer having defined therein a relief image;
positioning the lithographic template in contact with the radiation sensitive material layer, the radiation sensitive material layer being between the template and the substrate;
applying pressure to the template, the radiation sensitive material thereby flowing into the relief pattern on the template;
transmitting radiation through the lithographic template to expose at least a portion of the radiation sensitive material layer on the substrate, thereby further affecting the pattern in the radiation sensitive material layer; and
removing the template from the substrate,
wherein the transparent conductive layer comprises at least one of a group consisting of zinc tin oxide ($Zn_2SnO_4$), zinc tin oxide ($ZnSnO_3$), zinc indium oxide ($Zn_2In_2O_5$), zinc oxide (ZnO), zinc oxide doped with aluminum (ZnO:Al), zinc oxide doped with fluorine (ZnO:F), zinc oxide doped with gallium, (ZnO:Ga), zinc oxide doped with boron (ZnO:B), zinc oxide doped with indium (ZnO:In), magnesium indium oxide ($MgIn_2O_4$), gallium indium oxide ($GaInO_3$), gallium indium oxide (($Ga,In$)$_2O_3$), indium tin oxide ($In_4Sn_3O_{12}$), indium oxide doped with tin ($In_2O_3$:Sn), cadmium tin oxide ($Cd_2SnO_4$), tin oxide ($SnO_2$), tin oxide doped with fluorine ($SnO_2$:F), tin oxide doped with antimony ($SnO_2$:Sb), and titanium nitride (TiN).

19. A method for making a device as claimed in claim 18 wherein the step of transmitting radiation through the lithographic template comprises transmitting deep ultraviolet light through the lithographic template.

20. A method for making a device comprising the steps of:
providing a substrate;
coating the substrate with a radiation sensitive material layer;
providing a lithographic template; wherein the lithographic template comprises;
a substrate having a surface;
a transparent conductive layer, deposited using a pressure less than 6 m Torr, on the surface of the substrate; and
an etched patterning layer formed on a surface of the transparent conductive layer, the etched patterning layer having defined therein a relief image;
positioning the lithographic template in contact with the radiation sensitive material layer, the radiation sensitive material layer being between the template and the substrate;
applying pressure to the template, the radiation sensitive material thereby flowing into the relief pattern on the template;
transmitting radiation through the lithographic template to expose at least a portion of the radiation sensitive material layer on the substrate, thereby further affecting the pattern in the radiation sensitive material layer; and
removing the template from the substrate, wherein the step of providing a lithographic template comprising a transparent conductive layer includes providing a transparent conductive layer characterized as one of zinc tin oxide ($Zn_2SnO_4$), zinc tin oxide ($ZnSnO_3$), zinc indium oxide ($Zn_2In_2O_5$), zinc oxide (ZnO), zinc oxide doped with aluminum (ZnO:Al), zinc oxide doped with fluorine (ZnO:F), zinc oxide doped with gallium, (ZnO:Ga), zinc oxide doped with boron (ZnO:B), zinc oxide doped with indium (ZnO:In), magnesium indium oxide ($MgIn_2O_4$), gallium indium oxide ($GaInO_3$), gallium indium oxide (($Ga,In$)$_2O_3$), indium tin oxide ($In_4Sn_3O_{12}$), indium oxide doped with tin ($In_2O_3$:Sn), cadmium tin oxide ($Cd_2SnO_4$), tin oxide ($SnO_2$), tin oxide doped with fluorine ($SnO_2$:F), tin oxide doped with antimony ($SnO_2$:Sb), or titanium nitride (TiN).

* * * * *

UNITED STATES PATENT AND TRADEMARK OFFICE
CERTIFICATE OF CORRECTION

PATENT NO.         : 7,432,024 B2                                              Page 1 of 1
APPLICATION NO.  : 11/423621
DATED              : October 7, 2008
INVENTOR(S)        : Talin et al.

It is certified that error appears in the above-identified patent and that said Letters Patent is hereby corrected as shown below:

Column 8, line 41, in claim 2, delete "gallium," and insert -- gallium --.

Column 9, line 54, in claim 18, delete "gallium," and insert -- gallium --.

Column 10, line 44, in claim 20, delete "gallium," and insert -- gallium --.

Signed and Sealed this

Twenty-third Day of November, 2010

David J. Kappos
*Director of the United States Patent and Trademark Office*